United States Patent [19]

Sakihama et al.

[11] Patent Number: 4,806,789
[45] Date of Patent: Feb. 21, 1989

[54] POWER SELECT CIRCUIT

[75] Inventors: Kazuhisa Sakihama; Takuya Fujimoto, both of Yokohama, Japan

[73] Assignee: Kabushiki Kaisha Toshiba, Kawasaki, Japan

[21] Appl. No.: 174,857

[22] Filed: Mar. 29, 1988

[30] Foreign Application Priority Data

Mar. 31, 1987 [JP] Japan .................................. 62-78611

[51] Int. Cl.$^4$ .......................... H03K 3/01; H03K 5/22; H03K 5/08; H03F 3/45
[52] U.S. Cl. .................................... 307/297; 307/494; 307/496; 307/451; 307/355; 307/364; 307/554; 307/568; 328/146; 328/147
[58] Field of Search ............... 307/491, 494, 496, 571, 307/576, 579, 585, 530, 450, 451, 350, 355, 364, 296.6, 296.8, 43, 44, 64, 554, 568; 328/146, 147

[56] References Cited

U.S. PATENT DOCUMENTS 4,527,076 7/1985 Matsuo et al. ...................... 307/494

OTHER PUBLICATIONS

Nikkei Electronics, 1986, 4.7 No. 392, p. 77.

Primary Examiner—Stanley D. Miller
Assistant Examiner—Trong Q. Phan
Attorney, Agent, or Firm—Finnegan, Henderson, Farabow, Garrett, & Dunner

[57] ABSTRACT

A first node is connected to an external power source via a switch. A second node is connected to an internal power source whose voltage is lower than that of the external power source. The first and second nodes are connected to an output node via first and second MOSFET switches. The output node is connected to a semiconductor circuit. The potentials at the first and second nodes are compared with each other by a voltage comparator connected between the output node and ground. A MOSFET is quickly turned on and off in response to the potential at the first node.

10 Claims, 5 Drawing Sheets

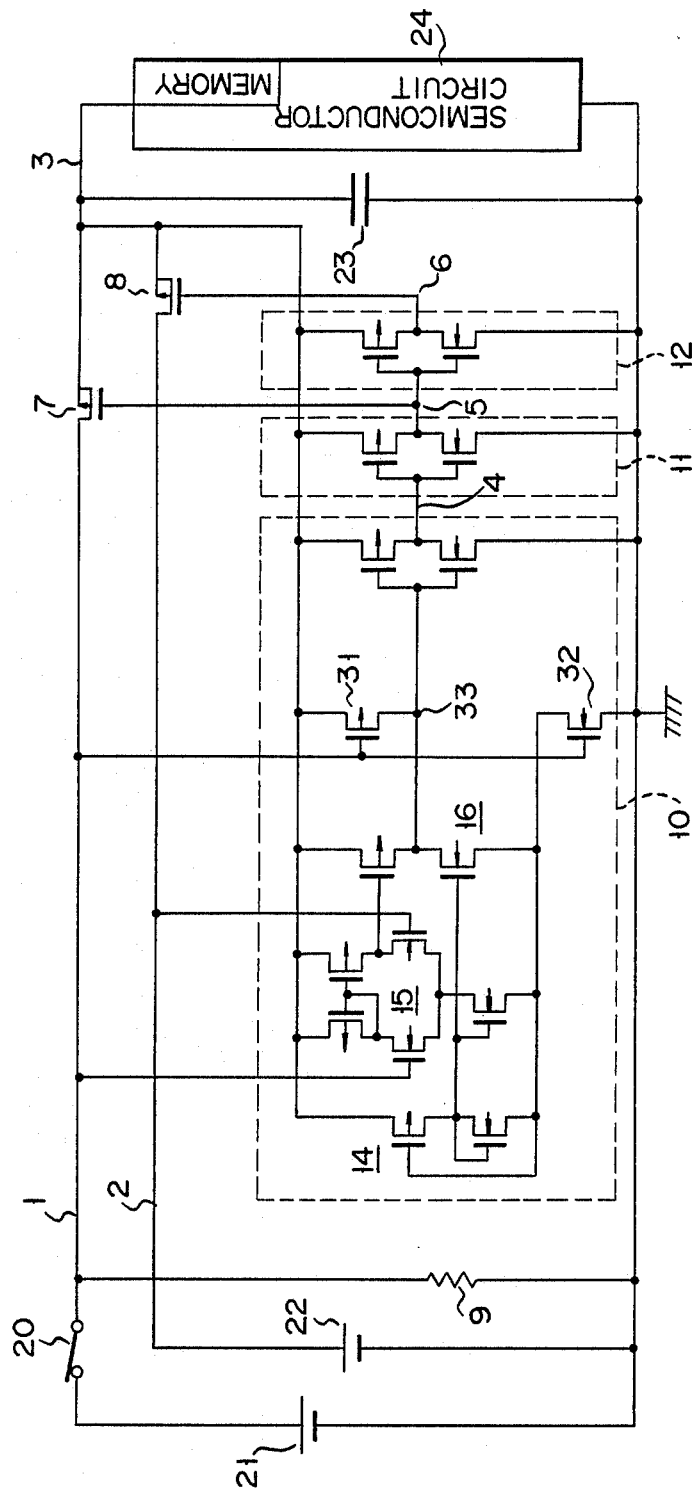
F I G. 3

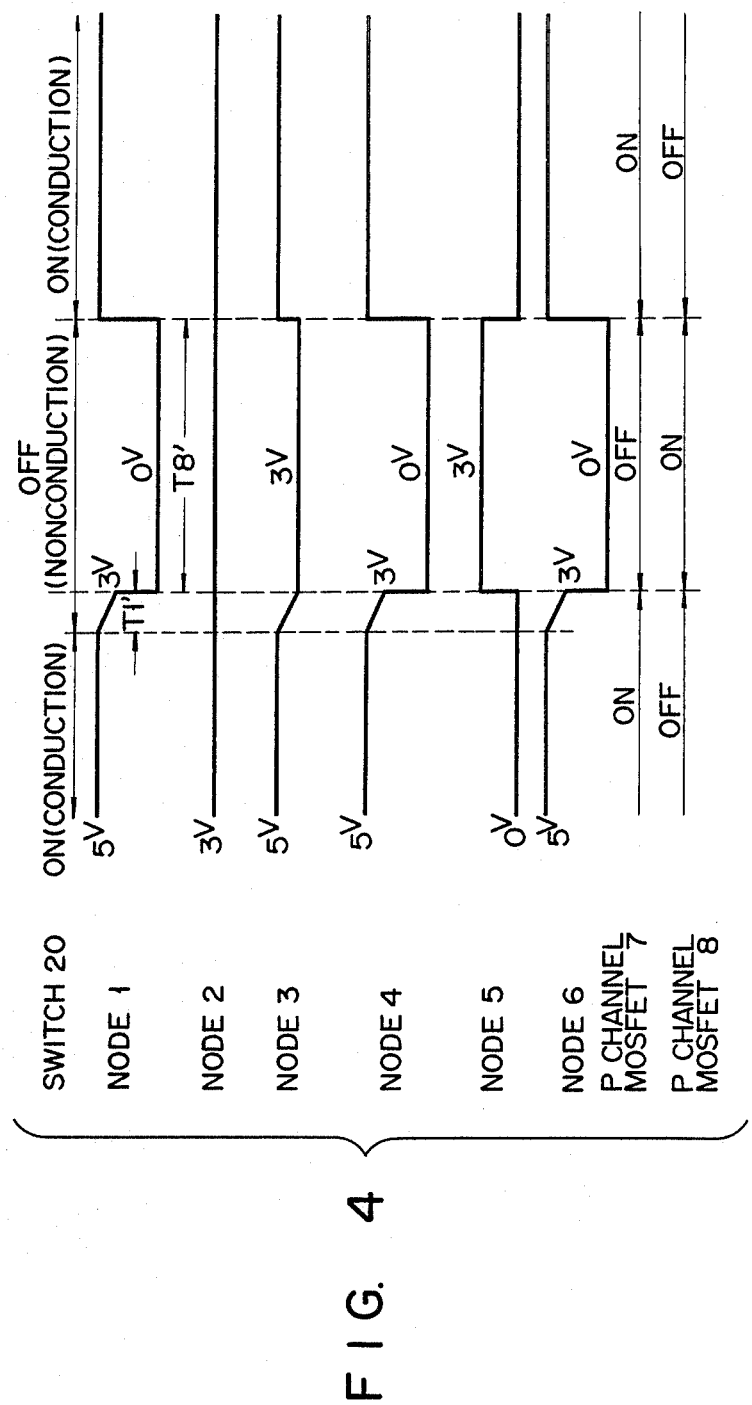
F I G. 4

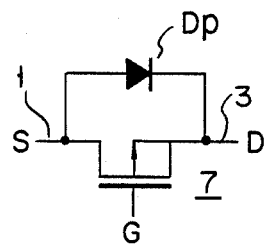
F I G. 5A
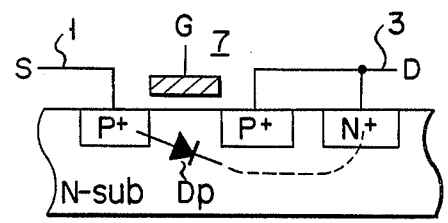
F I G. 5B
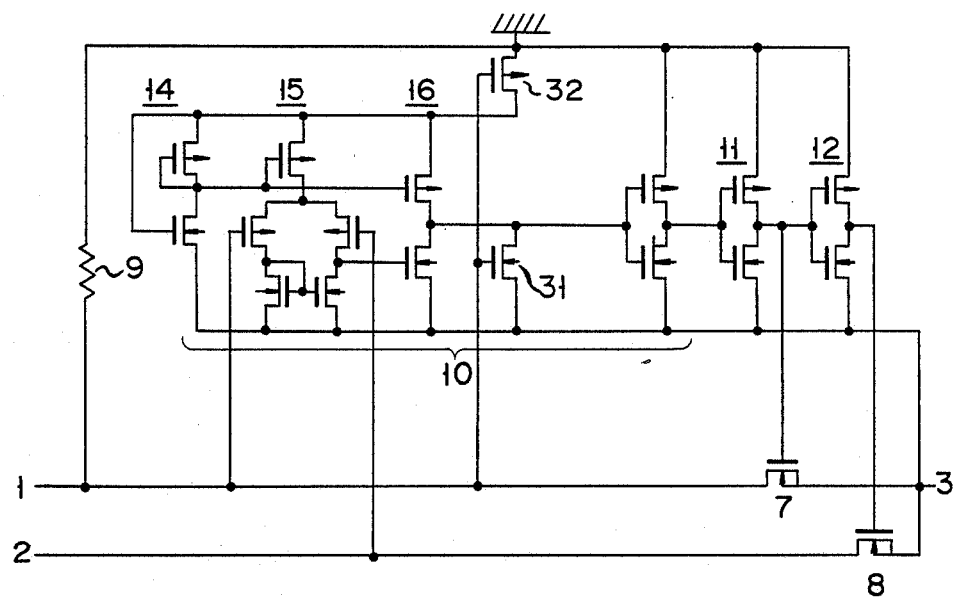
F I G. 6

POWER SELECT CIRCUIT

BACKGROUND OF THE INVENTION

1. Field of the Invention

This invention relates to a power select circuit well adapted for an electronic device using a semiconductor integrated circuit, such as an IC card selectively driven by two power supply systems, an internal power source and an external power source.

2. Description of the Related Art

The IC card is selectively driven by an internal power source at 3 V and an external power source at 5 V. When the 5 V external power source is not supplied, the IC card is driven by the 3 V power source. When the external power source is supplied, a power select circuit operates to stop the power supply by the internal power source, and the IC card is driven by the external power source.

FIG. 1 shows a circuit diagram of a conventional power select circuit. In the figure, node 1 is connected to external power source 21 at 5 V via switch 20. Node 2 is always coupled with internal power source 22 at 3 V. Node 1 is connected to ground potential via resistor 9. Nodes 1 and 2 are respectively connected to the noninverting input terminal and the inverting input terminals of differential input section 15 in voltage comparator 10. Voltage comparator 10 contains bias generator 14, and output amplifier 16, and differential input section 15 and output amplifier 16 are driven by the output bias of bias generator 14. Node 1 is connected to output node 3 via MOSFET 7. Node 2 is connected to output node 3 via MOSFET 8. Semiconductor circuit 24 is connected between node 3 and ground, with a capacitor 23 connected in parallel therewith to stabilize the output voltage. The output signal of voltage comparator 10 is supplied to the gate of MOSFET 7 via inverter 11, and further connected to the gate of MOSFET 8 by way of inverter 12.

When a voltage at 5 V is supplied to node 1, from external power source 21, high logical level "1" appears at the input of inverter 11, because the plus input of voltage comparator 10 is at 5 V, and the minus input of the same at 3 V. Therefore, MOSFET 7 is turned on, while MOSFET 8 is turned off. Semiconductor circuit 24 is energized by external power source 21 at 5 V. When switch 20 is turned off, node 1 is at ground potential, and the output logical level of voltage comparator 10 is "0". Then, MOSFET 7 is turned off, while MOSFET 8 is turned on. As a result, semiconductor circuit 24 is energized by internal power supply 22.

FIG. 2 shows a set of waveforms useful in explaining the operation of the circuit of FIG. 1. This chart illustrates voltage variations at the nodes when switch 20 is sequentially turned on, off and on. Let us look at the voltage at output node 3 during period T6 when switch 20 is in an off state (see FIG. 2). Since node 3 is for supplying the positive electric power to semiconductor circuit 24, it is necessary to take some measure to stabilize the voltage. To this end, this instance uses stabilizing capacitor 23. During period T6, the voltage of node 3 should be maintained at 3 volts. The voltage, however, drops below 3 volts which is supplied from internal power source 22. This is because MOSFET 8 is in an off state during period T6. For this reason, there is a danger that since the power voltage drop is excessive, semiconductor circuit 24 for receiving the power from node 3 may operate erroneously. For example, if the data stored in the memory of semiconductor circuit 24 is destroyed, the detriment is serious even after period T6 terminates, and the potential at node 3 is restored to 3 V. The delay of turning on of MOSFET 8 is due to the presence of a total of response times (T3+T4+T5) between the input and the output of voltage comparator 10, and inverters 11 and 12. The larger this response time, the lower the minimum voltage at node 3. This is an undesirable matter (First problem).

Let us consider period T7 from an instant that switch 20 is turned on till MOSFET 8 is turned off, when switch 20 is switched from off state to on state. During this period T7, a DC current flows into the path including nodes 1, 3 and 2, via a parasitic diode in P channel MOSFET 7 and turned-on MOSFET 8. This current is a reverse current for internal power source 22, possibly deteriorating the battery 22.

This current flow is caused by the turn-on delay of MOSFET 8 and by the delay of input/output response periods T3', T4' and T5' of voltage comparator to and inverters 11 and 12. When this input/output response period increases, the current flowing period in the reverse direction increases, thereby resulting an insufficient operation. Particularly, in the case of the IC card, the battery as the power source must be continuously used for at least 2 to 3 years. In this respect, it is undesirable that the circuit involves some cause for the battery deterioration (Second problem).

A fixed current as a bias current constantly flows in voltage comparator 10. It is preferable to minimize this. Because, as noted above, the power consumption of the battery used in the IC card should be minimized for using the IC card for at least two or three years without changing the battery. However, a necessary amount of current consumption is indispensable for the normal operation of the voltage comparator. (Third problem).

To solve the first and second problems, it is necessary to speed up the operation of inverters 11, 12 and voltage comparator 10. To this end, parasitic capacitive loads appearing at the respective nodes in voltage comparator 10 and an output node thereof should be driven by a large amount of current, which is realized by increasing a bias current usually flowing in voltage comparator, or by enlarging the gate width of an MOSFET. The operation speed of inverters 11 and 12 can be increased by enlarging the gate width of MOSFETs forming these inverters. The above mentioned solution, however, further promotes the third problem.

SUMMARY OF THE INVENTION

Accordingly, an object of this invention is to provide a power select circuit which can attain the contradictory objectives, to improve the operation speed of the circuit, and to reduce the current consumption.

According to this invention, there is provided a power source select circuit having first MOSFET whose source is connected to a first power voltage input terminal, and drain and back gate are connected to a power voltage output terminal, second MOSFET whose source is connected to a second power voltage input terminal, and drain and back gate are connected to the power voltage output terminal, a voltage comparator for comparing the potentials at the first and second power voltage input terminals, and for determining the output value on the basis of the comparison result, means for rendering the first MOSFET conductive when a potential difference between the first power voltage input terminal and ground, is larger than that between the second power voltage input terminal and ground, and for rendering the second MOSFET conductive when the former is smaller than the latter, in which the voltage comparator further comprising a third MOSFET for blocking the flow of a constant current in the voltage comparator when the first power voltage input terminal is at a potential near ground potential; and a fourth MOSFET for stabilizing the output voltage of the voltage comparator when the first power voltage input terminal is at a potential near ground potential.

The power source select circuit includes a voltage comparator. The comparator is so designed that a constant bias current flowing therein is set to be large, so as to quicken its operation. This is allowed for the reason that a relatively large power consumption is allowed when the external power source is used. When an internal power source is used, the bias current is stopped. To this end, a MOSFET is used for selecting an ON state and an OFF state of the bias current in the voltage comparator, and another MOSFET is used for stabilizing the output voltage of the voltage comparator when the bias current is stopped.

BRIEF DESCRIPTION OF THE DRAWINGS

FIG. 3 shows a circuit diagram according to an embodiment of a power select circuit;

FIG. 4 shows a set of waveforms useful in explaining the operation of the FIG. 3 circuit;

FIG. 5A shows a circuit diagram of a diode parasitic on the MOSFET in the FIG. 3 circuit;

FIG. 5B shows a sectional view of the MOSFET of FIG. 5A;

FIG. 6 shows a circuit diagram of a modification of the FIG. 3 embodiment.

DETAILED DESCRIPTION OF THE PREFERRED EMBODIMENT

Figure 1:
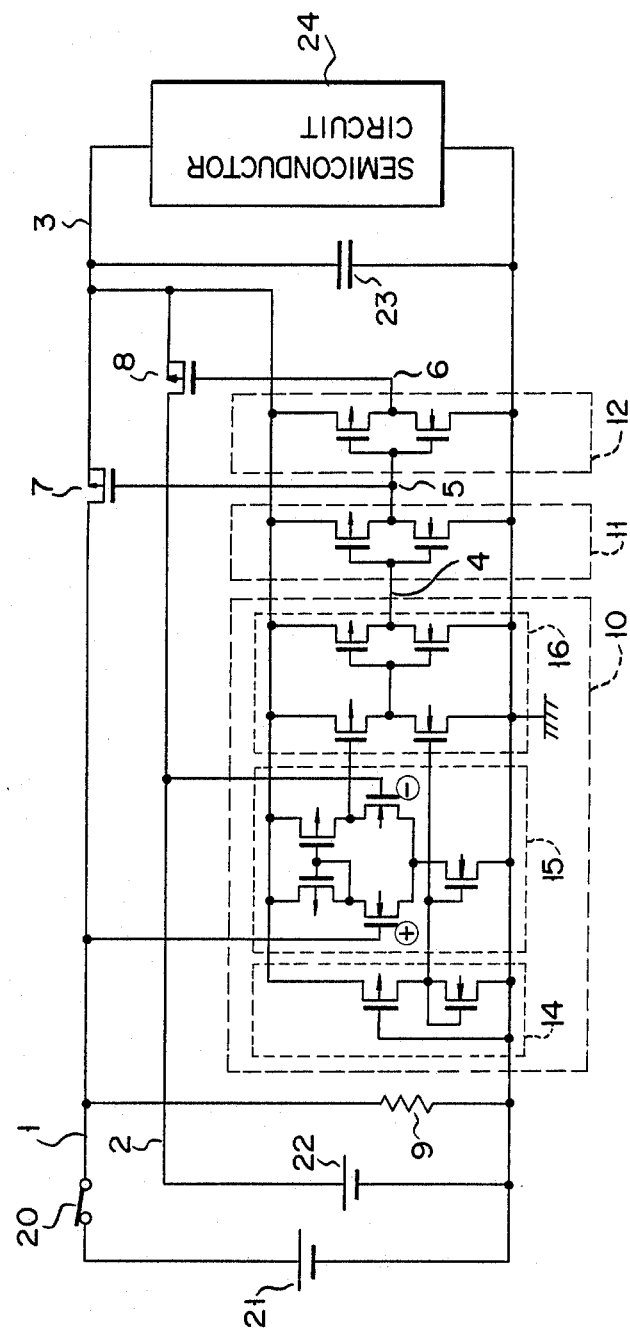
FIG. 1 shows a circuit diagram of a conventional power select circuit.
Figure 2:
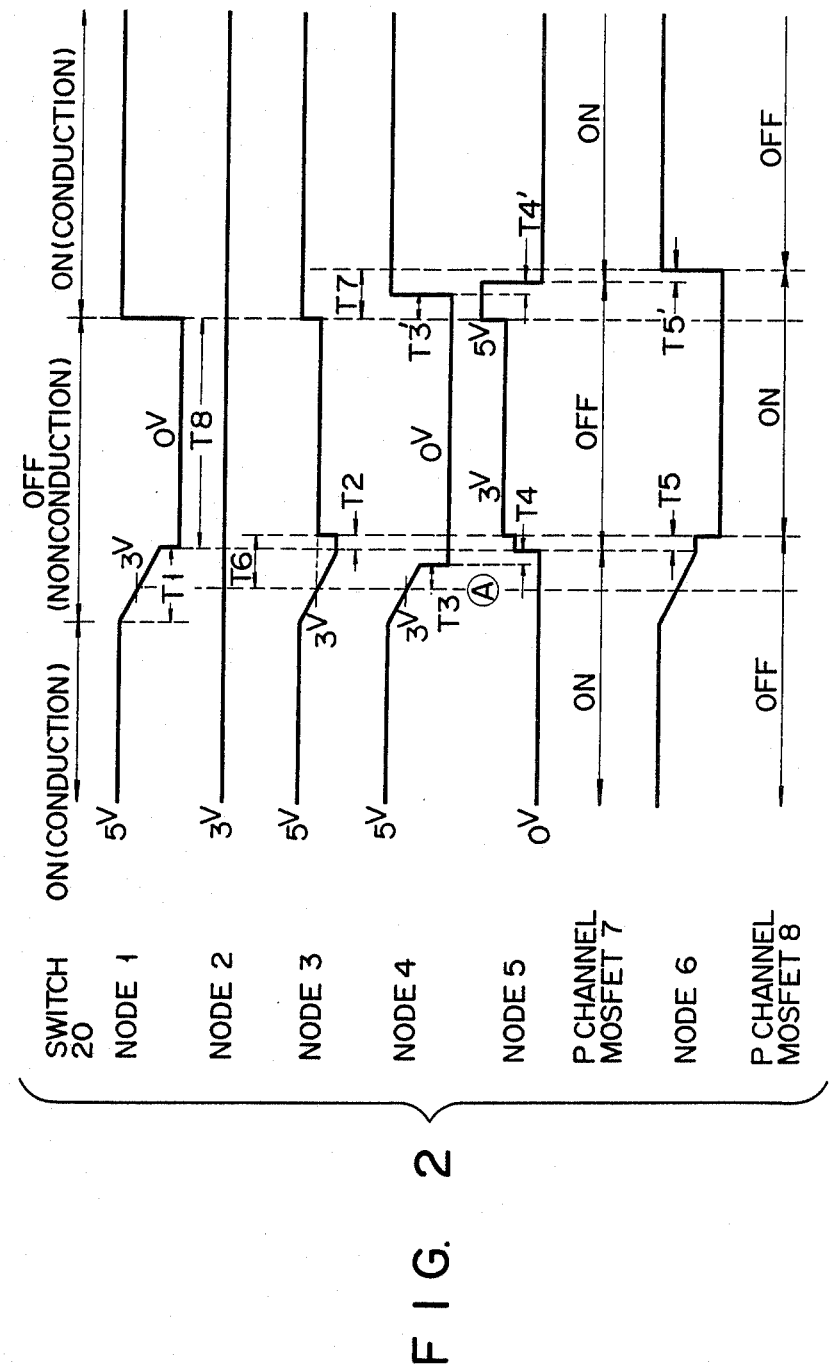
FIG. 2 shows a set of waveforms useful in explaining the operation of the FIG. 1 circuit.

A preferred embodiment of this invention will be described in detail referring to the accompanying drawings. In FIG. 3, like portions are designated by like reference symbols in FIG. 1. One of the major differences of the FIG. 3 circuit from the FIG. 1 circuit resides in that two MOSFETs 31 and 32 are provided in voltage comparator 10. The remaining portions are designated by like reference symbols, and explanation of them will be omitted. The gates of MOSFETs 31 and 32 are both connected to node 1. The source of MOSFET 31 is connected to node 3, and its drain is connected to node 33 in output amplifier 16. The drain of MOSFET 32 is connected to the lower power voltage terminals of bias generator 14, differential input section 15, and output amplifier section 16, and its source is grounded.

The operation of the FIG. 3 circuit will be described referring to FIG. 4. When switch 20 is turned on, P channel MOSFET 31 is turned off, and N channel MOSFET 32 is turned on, so that nodes 1 and 3 are at 5 V, and node 2 is at 3 V.

This fact implies that the current consumed by voltage comparator 10 and inverters 11 and 12 can be set large, and the element size and the bias voltage can be set large for making the circuit operation speed high.

Therefore, the embodiment of FIG. 3 can remarkably reduce the prior art problem, the delay times T3, T4, T5, T3', T4', and T5', to negligible values, as shown in FIG. 4. Therefore, the voltage at node 3 is kept equal to or above 3 V, to completely eliminate the possibility to fatally damage such as the breakage of data stored in the memory contained in semiconductor circuit 24.

During period T8', MOSFET 32 is turned off and voltage comparator 10 is brought to an inoperative state. At this time, however, MOSFET 31 has been turned on, the output of voltage comparator 10 is stable and a ground voltage is stably output. Since MOSFET 32 is kept at the off state, the current consumption at voltage comparator 10 may be reduced to a negligible amount.

When switch 20, which has been in an off state, is turned on, the voltage at node 1 rises from 0 V to 5 V, MOSFET 31 is turned off and MOSFET 32 is turned on, so that voltage comparator 10 executes the voltage comparing operation. During a transient period that switch 20 changes its state from the off-state to the on-state, node 3 changes its voltage from 3 V to 5 V. The reason for this is that the forward current flows into diode Dp parasitic on MOSFET 7, as shown in FIGS. 5A and 5B. Application of the "0" level signal to the gate of MOSFET 7 is not the cause of the voltage increase at node 3. As seen from this, during the transient period that the operation state of switch 20 is changed from the off-state to the on-state, an inoperative condition of voltage comparator 10 is allowed. To utilize this phenomenon, this embodiment is so designed that voltage comparator 10 is rendered operative only during this on to off transient period of switch 20.

In this embodiment shown in FIG. 3, with the reference potential set at 0 V, the power voltage is switched between the two types of plus voltages, i.e., 3 V and 5 V. Alternatively, two types of minus voltages, e.g., −3 V and −5 V, may be used in place of the above two types of plus voltages, with the same reference potential. This technical idea can be implemented as shown in FIG. 6. In this circuit, like reference symbols are used for designating like portions shown in FIG. 3. The operation of FIG. 6 is similar to that of FIG. 3, and therefore its explanation will be omitted here.

The arrangement of voltage comparator 10 is not limited to the above-mentioned arrangement. For example, the portions except MOSFETs 31 and 32 may be variously modified and changed within the scope of this invention.

As described above, according to the power select circuit of this invention, the circuit section operative only when the external power supply is supplied thereto may be designed so that the current consumption therein can be set to be large. Therefore, measures such as an increase of bias current and/or the enlargement of the element geometry can be performed, realizing a high speed circuit operation. When the internal power supply is used, the voltage comparator is made inoperative, to minimize the power consumption and hence to realize the long lifetime of the internal power source.

What is claimed is:
1. A power source select circuit comprising:
first MOSFET whose source is connected to a first power voltage input terminal, and drain and back gate are connected to a power voltage output terminal;
second MOSFET whose source is connected to a second power voltage input terminal, and drain and back gate are connected to said power voltage output terminal;

a voltage comparator for comparing the potentials at said first and second power voltage input terminals, and for determining the output value on the basis of the comparison result;

a first means, connected to said first MOSFET and said voltage comparator for rendering said first MOSFET conductive when a potential difference between said first power voltage input terminal and ground, is larger than that between said second power voltage input terminal and ground, a second means, connected to said second MOSFET and said voltage comparator, for rendering said second MOSFET conductive when a potential difference between said first power voltage input terminal and ground is smaller than that between said second power voltage input terminal and ground wherein said voltage comparator further comprises:

a third MOSFET for blocking the flow of a constant current in said voltage comparator when said first power voltage input terminal is at a potential near ground potential; and a fourth MOSFET connected to said first power voltage input terminal and the output of said voltage comparator for stabilizing the output voltage of said voltage comparator when said first power voltage input terminal is at a potential near ground potential.

2. The power source select circuit according to claim 1, in which said second MOSFET is used as a switch interconnected between an internal power source and a semiconductor circuit through said power voltage output terminal.

3. The power source select circuit according to claim 1, in which the potential at said first power voltage input terminal is set to be higher than that at said second power voltage input terminal.

4. The power source select circuit according to claim 1, further comprising a resistive means connected between said first power voltage input terminal and ground potential.

5. The power source select circuit according to claim 1, in which the source of said first MOSFET is connected to said first power voltage input terminal via an ON/OFF switch.

6. The power source select circuit according to claim 4, in which the source of said first MOSFET is connected to said first power voltage input terminal via an ON/OFF switch.

7. The power source select circuit according to claim 1, in which said voltage comparator is connected between said first power voltage input terminal and ground through said third MOSFET.

8. The power source select circuit according to claim 7, in which said third MOSFET includes a gate connected to said first power voltage input terminal.

9. The power source select circuit according to claim 8, in which said fourth MOSFET includes a source connected to the power voltage output terminal and a drain connected to an output of a circuit of which a current is blocked by the third MOSFET.

10. The power source select circuit according to claim 9, in which said fourth MOSFET includes a gate which is connected, together with the gate of said third MOSFET, to first power voltage input terminal.

* * * * *